(12) United States Patent
Fasoli

(10) Patent No.: US 6,490,197 B1
(45) Date of Patent: Dec. 3, 2002

(54) SECTOR PROTECTION CIRCUIT AND METHOD FOR FLASH MEMORY DEVICES

(75) Inventor: Luca Giovanni Fasoli, Fremont, CA (US)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 09/922,043

(22) Filed: Aug. 2, 2001

(51) Int. Cl.[7] .............................................. G11C 16/04
(52) U.S. Cl. ............................ 365/185.04; 365/185.33; 365/230.06
(58) Field of Search ....................... 365/185.04, 185.33, 365/230.06, 191, 185.05, 241

(56) References Cited

U.S. PATENT DOCUMENTS

| | | | | |
|---|---|---|---|---|
| 5,544,356 A | * | 8/1996 | Robinson et al. | 365/185.11 |
| 5,954,828 A | * | 9/1999 | Lin | 365/201 |
| 6,031,757 A | * | 2/2000 | Chuang et al. | 365/185.04 |
| 6,032,237 A | * | 2/2000 | Inoue et al. | 365/195 |
| 6,331,950 B1 | * | 12/2001 | Kuo et al. | 365/185.18 |

OTHER PUBLICATIONS

Advance Micro Devices, Inc.; *"Preliminary Data Sheets for Am29LV160D, 16 Megabt, CMOS3.0 Volt–only Boot Sector Flash Memory"*; Apr. 19, 1999; pp. 1–47.

STMicroelectronics; *"AN1122—Application Note*, Applying Protection and Unprotection to M29 Series Flash Memories"; May 1999; pp. 1–9.

* cited by examiner

*Primary Examiner*—David Nelms
*Assistant Examiner*—Thong Le
(74) *Attorney, Agent, or Firm*—Lisa K. Jorgenson; Andre Szuwalski

(57) ABSTRACT

A method and circuit are disclosed for providing sector protection to sectors of nonvolatile memory cells in a nonvolatile memory device. The circuit includes maintaining sector protection information in the core of memory cells in the nonvolatile memory device. In this way, the circuitry and/or algorithms utilized for reading and modifying memory cells in the memory cell core that maintain the sector protection information is the same utilized for reading and modifying the other memory cells in the core.

31 Claims, 3 Drawing Sheets

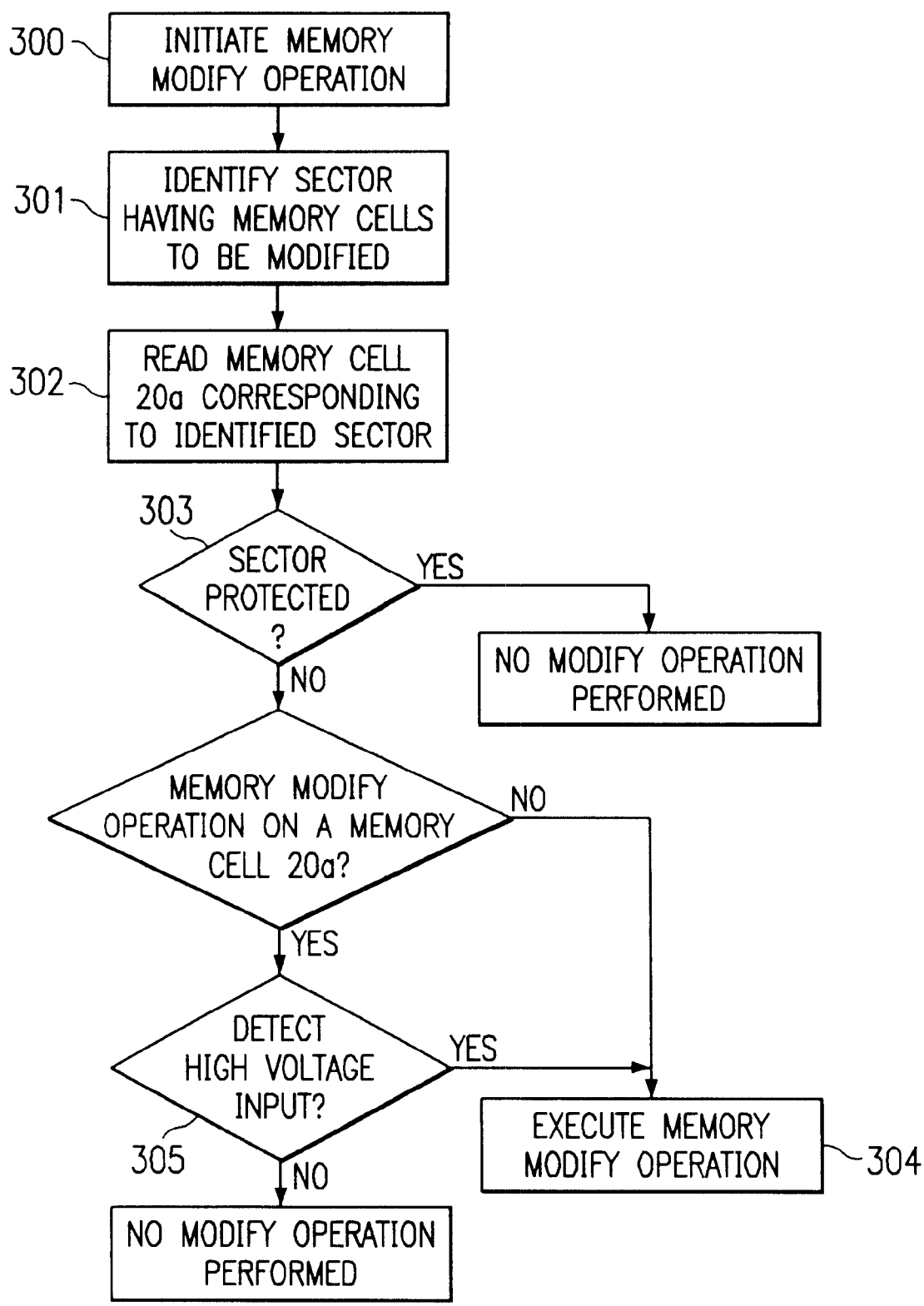

SECTOR PROTECTION CIRCUIT AND METHOD FOR FLASH MEMORY DEVICES

BACKGROUND OF THE INVENTION

1. Technical Field of the Invention

The present invention relates to nonvolatile memory devices, and particularly to nonvolatile memory devices having sector protection circuitry.

2. Description of the Related Art

The first nonvolatile memories were electrically programmable read-only memories (EPROMS). In these memories, the memory cells include a floating-gate transistor that is programmable using the hot carrier effect. Programming of an EPROM memory cell includes applying a potential difference between the drain and the source of the floating gate transistor in the presence of a high potential difference (of about 20 volts, this value varying according to the desired programming speed) between the control gate and the source. The application of the first of these potential differences generates an electrical field that gives rise to a flow of electrons in the channel. These electrons collide with atoms of the channel, causing the appearance of new free electrons. These electrons have very high energy (hence the term "hot carriers"). The high difference in potential between the control gate and the source of the floating gate transistor gives rise to a strong electrical field between the floating gate and the substrate, the effect of which is that certain of these electrons are injected into the floating gate, thus putting the memory cell in a state known as a "programmed" state.

The fact that the programming of a memory cell requires the application of voltages both to the control gate and to the drain of the floating-gate transistor eliminates the need for the use of a selection transistor to program one particular memory cell without programming the others. This results in a relatively small silicon area and the effectuation of large scale integration. By contrast, the erasure of all the memory cells of the memory is done substantially simultaneously by exposing the memory cells to ultraviolet radiation.

In addressing the need to individually erase EPROM memory cells, electrically erasable programmable read only memories (EEPROMs) were created. These memories are electrically programmable and erasable by tunnel effect (i.e., the Fowler Nordheim effect). The memory cells have a floating-gate transistor whose drain is connected to the bit line by a selection transistor. The gate of the selection transistor is connected to the word line. The gate of the floating-gate transistor is controlled by a bias transistor. Generally, the source of the floating gate transistor is connected to a reference potential, such as ground. These floating-gate transistors have an oxide layer between the substrate and the floating gate that is very thin to enable the transfer of charges by tunnel effect. The advantage of EEPROMs as compared with EPROMs lies in the fact that each memory cell is programmable and erasable independently of the other EEPROM cells. The tradeoff here is that a larger surface area of silicon is required and therefore a smaller scale of integration is achieved.

A third type of memory has more recently gained popularity. This type of memory, flash EPROMs, combines the relatively high integration of EPROMs with the ease of programming and erasure of EEPROMs. Flash memory cells can be individually programmed utilizing the hot carrier effect in the same way as EPROM cells are programmed. Flash memory cells are also electrically erasable by the tunnel effect. The memory cells of a flash EPROM memory includes a floating-gate transistor that has an oxide layer whose thickness is greater than the oxide layer thickness of an EEPROM floating gate transistor but smaller than the oxide layer thickness of an EPROM floating gate transistor. Consequently, the flash memory cell is capable of erasure by the tunnel effect. For erasure, a highly negative potential difference is created between the control gate and the source of the floating gate transistor, the drain being left in the high impedance state or connected to the ground potential so that a high electrical field is created which tends to remove the electrons from the floating gate.

Referring to FIG. 1, flash EPROM devices, hereinafter referred to as flash memory devices, typically include at least one array A of flash memory cells organized into rows and columns of flash memory cells. Array A is typically partitioned into blocks B, each of which is further divided into sectors S. A row decoder R and column decoder C are used to select a single row and at least one column of memory cells based upon the value of an externally generated address applied to the flash memory device. Sense amplifiers SA are coupled to the column lines corresponding to the columns of memory cells to amplify the voltage levels on the addressed column lines corresponding to the data values stored in the addressed flash memory cells. The particular implementations of array A, the row and column decoders and sense amplifiers SA are known in the art and will not be described further for reasons of simplicity.

Conventional nonvolatile memory devices, including flash memory devices, typically provide some type of modify protection so that one or more sectors in the nonvolatile memory device is read only. In one prior implementation, sector protection for a flash memory device is effectuated using software external to the nonvolatile memory device and volatile circuitry. In another prior implementation, sector protection is performed within the flash memory device in nonvolatile circuitry. In this implementation, the flash memory device includes sector protection circuitry for preventing data modification within an identified sector.

With reference to FIG. 1, the sector protection circuitry includes nonvolatile secondary storage elements disposed adjacent array A in the periphery of the flash memory device, for storing information that identifies sectors S that are to be modify protected. A command user interface U receives user-generated memory access operation commands and sends command information to circuits within the flash memory device for executing and/or managing the execution of the user-generated commands.

The existing flash memory device further includes access circuitry for reading, programming and erasing the secondary storage elements. A controller generally manages memory read and memory modify operations of memory cells within array A. Prior to managing/controlling a user-requested memory modify operation, the controller receives sector protection information from the secondary storage elements as well as user command information from the command user interface U, and determines whether the flash memory cells to be modified by the user-requested memory modify operation is in a sector S that is modify protected. Upon an affirmative determination that the flash memory cells to be modified are in a modify protected sector S, the controller prevents the memory modify operation from performing. Otherwise, the controller controls the various components/blocks within the flash memory device for executing the user-requested memory modify operation.

One shortcoming in having the above-discussed sector protection circuitry within the flash memory device is that rather complex algorithms are necessary in order to modify the information maintained by the secondary storage elements. The complex algorithms understandably result in more complicated circuitry being used in the existing flash memory device.

Based upon the foregoing, there is a need for more easily providing sector protection within a nonvolatile memory device, such as a flash memory.

SUMMARY OF THE INVENTION

Embodiments of the present invention overcome shortcomings in prior flash memory devices and satisfy a significant need for a nonvolatile memory device having a simpler technique for providing sector protection. In embodiments of the present invention, sector protection information is maintained in a set of memory cells in the core of nonvolatile memory cells. Control circuitry in the nonvolatile memory device selectively prevents memory modify operations in an addressed sector from being performed upon an affirmative determination that a memory cell in the set indicates that the addressed sector is modify protected. By including sector protection information in the core of memory cells, the circuitry used for reading and modifying the set of memory cells containing the sector protection information is the same circuitry used for reading and modifying the other memory cells in the memory cell core.

BRIEF DESCRIPTION OF THE DRAWINGS

A more complete understanding of the system and method of the present invention may be obtained by reference to the following Detailed Description when taken in conjunction with the accompanying Drawings wherein:

FIG. 3 is a flow chart illustrating an operation of the nonvolatile memory device of FIG. 2.

DETAILED DESCRIPTION OF THE EXEMPLARY EMBODIMENTS OF THE PRESENT INVENTION

The present invention will now be described more fully hereinafter with reference to the accompanying drawings in which an exemplary embodiment of the invention is shown. This invention may, however, be embodied in many different forms and should not be construed as being limited to the embodiment set forth herein. Rather, the embodiment is provided so that this disclosure will be thorough and complete, and will fully convey the scope of the invention to those skilled in the art.

Figure 2:
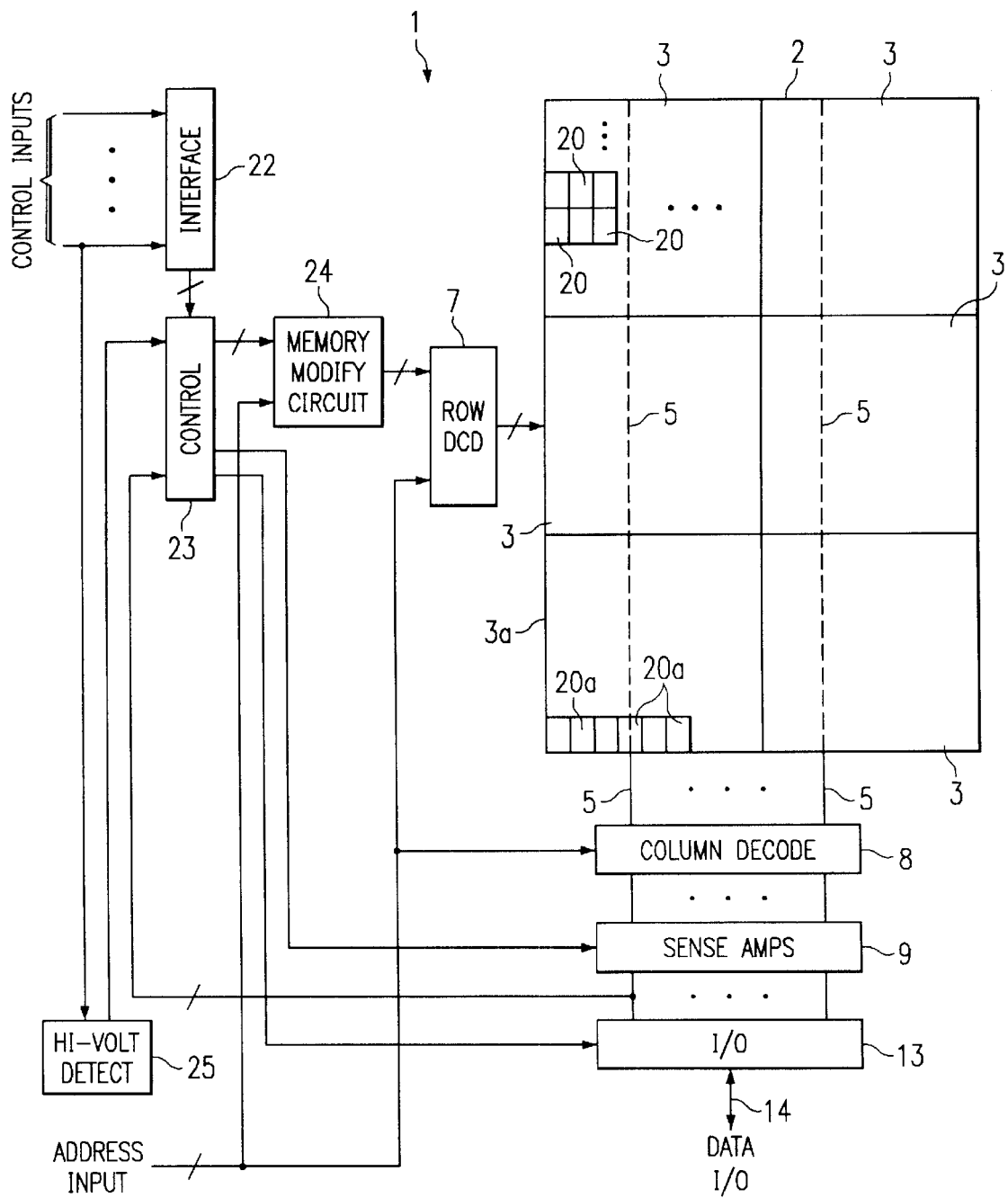
FIG. 2 is a block diagram of a nonvolatile memory device according to an exemplary embodiment of the present invention.

Referring to FIG. 2, there is shown a nonvolatile memory device 1 according to an exemplary embodiment of the present invention. Although it is understood that the nonvolatile memory device 1 may be virtually any type of nonvolatile memory device, nonvolatile memory device 1 will be described below as a flash memory device for reasons of simplicity.

Flash memory device 1 includes a core or array 2 of memory cells 20. Array 2 of memory cells 20 may be arranged into rows and columns of memory cells 20. According to the exemplary embodiment of the present invention, array 2 is partitioned into sectors 3 of memory cells 20. Although array 2 is illustrated in FIG. 2 as being divided into six sectors 3 of memory cells 20, it is understood that array 2 may be divided into a different number of sectors 3.

Array 2 is shown in FIG. 2 as being relatively sparsely populated with memory cells 20 for reasons of clarity. It is understood that array 2 is substantially entirely populated with memory cells 20, arranged in rows and columns of memory cells 20 as described above.

The memory cells 20 in each column of memory cells 20 in a sector 3 may be connected to a distinct column line 5, and the memory cells 20 in each row of memory cells 20 in a sector 3 may be connected to a distinct row line. Column lines 5 may be local column lines that are coupled to main column lines (not shown in FIG. 2) for providing the selected local column lines to the periphery of array 2. The use of local and main column lines in flash memories are known in the art and will not be described in greater detail for reasons of simplicity.

Flash memory device 1 may further include row decode circuitry 7 which receives an externally generated address or portion thereof and selects and/or activates a row of memory cells 20 in a sector 3. In particular, the row of memory cells 20 corresponding to the externally generated address is selected and/or activated by being connected to column lines 5. Row decode circuitry 7 may include logic that, for example, in response to receiving an externally generated address, drives a single row line corresponding to the externally generating address to a first voltage level to activate each memory cell in the row, while driving the remaining row lines to another voltage level to deactivate the memory cells 20 in the remaining rows. Row decode circuitry 7 may be implemented with boolean logic gates as is known in the art.

Further, flash memory device 1 may include column decode circuitry 8 which receives an externally generated address and selects one or more column lines 5 corresponding to the externally generated address. Column decode circuitry 8 may, for example, be implemented as multiplexing circuitry connected to each column line 5 in array 2.

During a memory read operation, addressed memory cells 20 are connected to the column lines 5 corresponding thereto. Typically, the connection of the addressed memory cells 20 to their corresponding column lines 5 results in the column lines 5 being at one of two or more voltage levels. Flash memory device 1 may include sense amplifiers 9 that sense the voltage levels on the column lines 5 corresponding to the data stored in the addressed memory cells 20 and drive sense amplifier output signals to voltage levels that are more easily interpreted or otherwise handled by circuitry external to array 2.

Flash memory device 1 may include a data input/output (I/O) circuit 13 that generally couples addressed memory cells 20 to external I/O data pins 14 of flash memory device 1. As shown in FIG. 2, data I/O circuit 13 is connected to sense amplifiers 9.

Flash memory device 1 may also include interface circuitry 22 for, in general terms, providing an interface with devices external to flash memory device 1. Interface circuitry 22 receives commands from external devices, such as commands/requests for performing a memory access operation, and presents the command information to circuitry internal to flash memory device 1. Interface circuitry 22 may, for example, be capable of receiving and interpreting memory access operation commands according to a universal or standard command set.

Flash memory device 1 includes a control circuit 23 which generally controls the various components of flash memory device 1 (row decode circuitry 7, column decode circuitry 8, sense amplifiers 9, data I/O circuit 13, etc.) to perform requested memory modify operations. Control circuit 23 may, for example, receive command information from interface circuitry 22 and in response control/manage the execution of the requested memory modify operation.

In performing a memory program operation or memory erase operation, additional tasks are necessary that are typically unneeded in order to execute a memory read operation. For instance, executing a memory program operation includes not only tasks for programming the addressed memory cells, but also tasks for verifying the programmed data values. A memory erase operation includes tasks for erasing in parallel each memory cell 20 in the addressed sector 3, followed by sequentially verifying the contents of each erased memory cell 20 and sequentially "soft" programming each erased memory cell 20 so as to maintain a desired set of current-voltage operating characteristics of the erased memory cells 20. Accordingly, flash memory device 1 includes memory modify circuitry 24 for cooperating with row decode circuitry 7, column decode circuitry 8 and sense amplifiers 9 in executing all of the tasks in a memory modify operation. Memory modify circuitry 24 may receive signals and be controlled by control circuit 23. An address output of memory modify circuitry 24 may be generated by an address counter circuit and applied to row decode circuit 7 and column decode circuit 8 for use during a requested memory modify operation.

As stated above, sector protection information in existing flash memory devices is stored in storage elements that are separate from the memory cell core. In addition, existing flash memory designs include rather complex circuitry for programming the storage elements. In the exemplary embodiment of the present invention, the sector protection information is instead stored in memory cells 20 of array 2.

Specifically, a set of memory cells 20a in a sector 3a are dedicated to maintaining sector protection information for any sector 3 in array 2. Each memory cell 20a in the set may be dedicated to maintaining sector protection information for a distinct sector 3. In a bilevel flash memory, for example, maintaining a high logic data value in a memory cell 20a may indicate that the sector 3 corresponding thereto is not modify protected, and a low logic data value may indicate that the corresponding sector 3 is modify protected. In a multilevel flash memory, sector protection information for a number of sectors 3 may be maintained in a single memory cell 20a.

It is understood that sector 3a may itself be modify protected. A memory cell 20a in the set of memory cells 20a may be dedicated to providing sector protection information for sector 3a, and may therefore indicate that such sector 3a is modify protected. Sector 3a may be smaller than other sectors 3 and include memory cells 20 that store, for example, one time programmable (OTP) data, including manufacturing code information, test information, etc. Programming/erasing memory cells 20a and/or any memory cell in sector 3a may also require additional tasks be undertaken that are unnecessary in programming/erasing memory cells 20 in other sectors 3, as described in greater detail below.

By maintaining sector protection information in array 2, the same circuitry and tasks for reading memory cells 20a are utilized in reading other memory cells 20 in array 2. In addition, the same circuitry and tasks for modifying memory cells 20a are utilized in modifying other memory cells 20 in array 2. Consequently, the amount of circuitry and the complexity of tasks performed within flash memory device 1 in executing memory access operations are reduced.

Flash memory device may include a high voltage detection circuit 25 having an input coupled to an input control signal of flash memory device 1 and an output signal. High voltage detection circuit 25 may detect the presence of a high voltage, i.e., a voltage greater than the operating supply voltage for flash memory device 1, appearing on the input control signal. Upon the detection of a high voltage appearing on an input control signal, high voltage detection circuit 25 may, for example, assert the output signal thereof. High voltage detection circuit 25 may provide additional security in attempting to modify the contents of memory cells 20a, as explained below. It is understood, however, that other circuitry may be used to provide additional security in modifying the contents of memory cells 20a.

A memory modify (program or erase) operation on memory cells in flash memory device 1 will be described with reference to FIG. 3. Initially, it is assumed that memory cells 20a already maintain sector protection information relating to sectors 3. Flash memory device 1 receives a request to perform a memory modify operation at 300. This may include interface circuitry 22 receiving input control and address signals from an external source and providing information relating to the memory modify operation to control circuit 23. Next, control circuit 23 may identify at 301 the particular sector 3 having the memory cells that are to be modified. Control circuit 23 may then control or initiate at 302 row decode circuit 7, column decode circuit 8 and sense amplifiers 9 for reading the data stored in at least some memory cells 20a and providing the data read to control circuit 23. At this point, control circuit 23 determines at 303 whether the sector 3 identified at 301 is modify protected, based upon the data value read from the memory cell 20a corresponding to the identified sector 3. In the event control circuit 23 determines that the identified sector 3 is modify protected, control circuit 23 does not cause the execution of the requested memory modify operation.

In the event control circuit 23 determines that the identified sector 3 is not modify protected and that the memory cells to be modified are not memory cells 20a (i.e., memory cells having the sector protection information), control circuit 23 controls at 304 memory modify circuitry 24, row decode circuit 7, column decode circuit 8 and sense amplifiers 9 for executing the requested memory modify operation.

In the event control circuit 23 determines that the identified sector 3 is not modify protected but the memory cells to be modified are memory cells 20a, control circuit 23 determines at 305 whether high voltage detection circuit 25 detected a high voltage appearing on the input signal received at the input of high voltage detection circuit 25 around the time the request for the memory modify operation was received. Upon a determination that high voltage detection circuit 25 detected a high voltage signal, control circuit 23 controls at 305 memory modify circuitry 24, row decode circuit 7, column decode circuit 8 and sense amplifiers 9 for executing the requested memory modify operation at 304. However, if the high voltage detection circuit 25 did not detect a high voltage appearing on its input signal around the time the request for the memory modify operation was received, control circuit 23 does not cause the execution of the requested memory modify operation.

It is understood that the chronological order of the steps discussed above and illustrated in FIG. 3 is not critical to the exemplary embodiment of the present invention. Rather, the order of the above-discussed steps may vary and still provide a suitable response to a request for a memory modify operation in accordance with the exemplary embodiment of the present invention.

Figure 1:
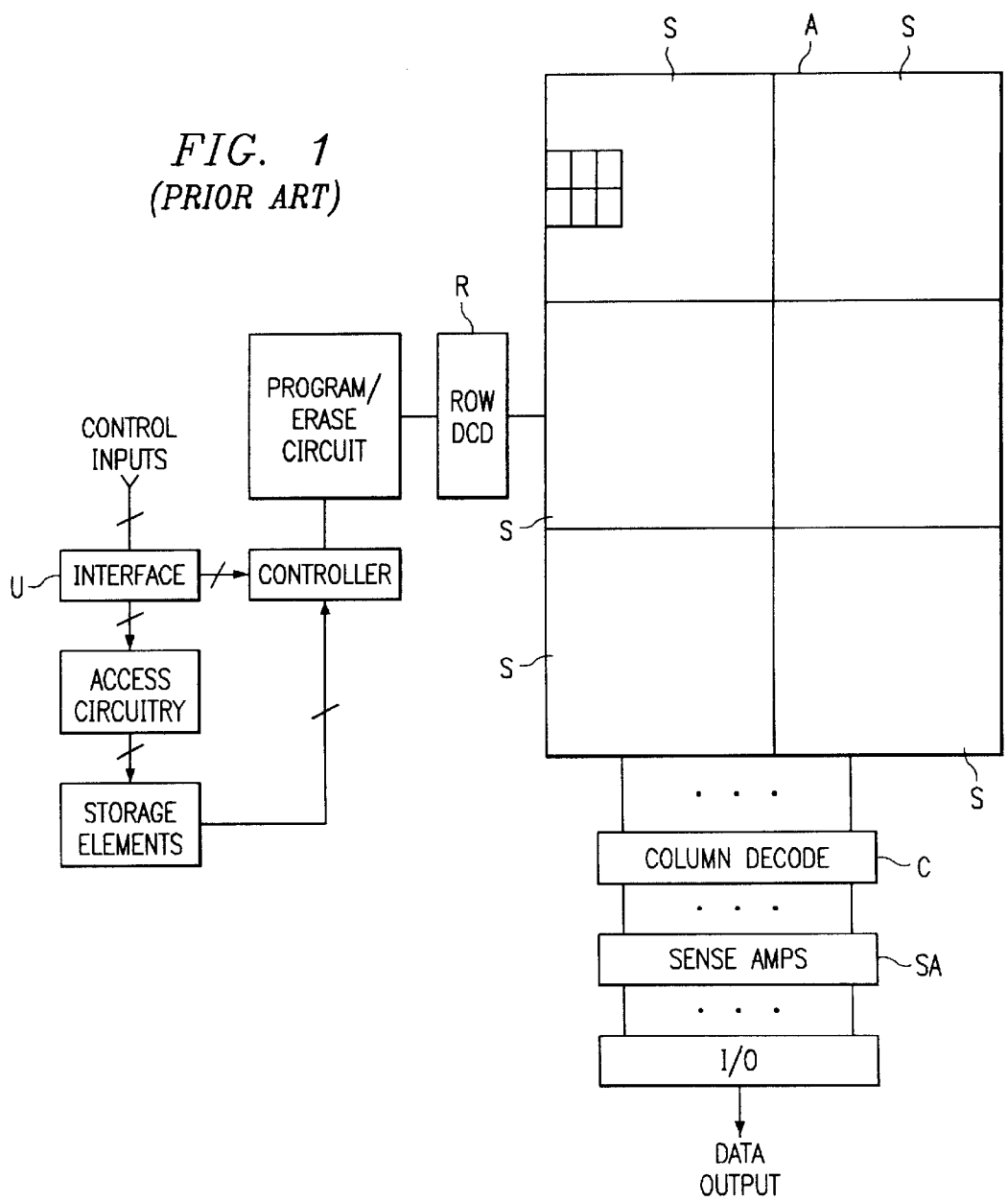
FIG. 1 is a block diagram of an existing flash memory device.
Figure 4:
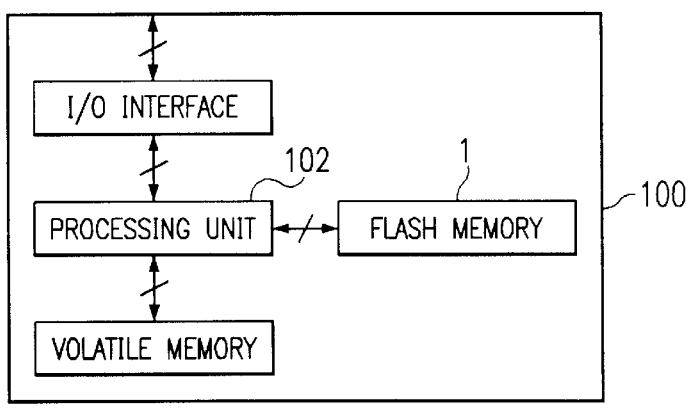
FIG. 4 is a block diagram showing an electronics device having therein the nonvolatile memory device of FIG. 1.

It is understood that flash memory device 1 may be utilized in any of a number of devices requiring nonvolatile memory. For instance, flash memory device 1 may be located in an electronics system 100 (FIG. 4) having a processing unit 102 that accesses data stored in flash memory device 1. System 100 may be, for example, a computer and/or data processing device, or a telecommunications device, such as a wireless telephone.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile memory device, comprising:
   an array of memory cells arranged into rows and columns and partitioned into a plurality of sectors of memory cells, memory cells in a first sector indicating at least one other sector as being modify protected;
   address decode circuitry for receiving an externally-generated address and selecting a row and at least one column of memory cells corresponding thereto;
   control circuitry, coupled to the address decode circuitry and the array of memory cells, for selectively preventing execution of a requested memory modify operation on memory cells in the at least one other sector upon an affirmative determination that at least one memory cell in the first sector indicates the at least one other sector as being modify protected.

2. The nonvolatile memory device of claim 1, wherein:
   a set of memory cells in the first sector is capable of identifying any sector of memory cells as being modify protected.

3. The nonvolatile memory device of claim 2, wherein:
   each memory cell in the set of memory cells is dedicated to indicating whether a distinct sector of memory cells is modify protected.

4. The nonvolatile memory device of claim 2, wherein:
   a memory cell in the set of memory cell is dedicated to indicating whether the first sector of memory cells is modify protected.

5. The nonvolatile memory device of claim 1, wherein:
   the control circuitry selectively controls execution of a requested memory modify operation on memory cells in the at least one other sector upon an affirmative determination that at least one memory cell in the first sector indicates the at least one other sector of memory cells is modifiable.

6. The nonvolatile memory device of claim 3, wherein:
   the control circuitry selectively controls execution of requested memory read operations on the at least one memory cell in the first sector of memory cells using the same sequence of internally executed operations used in controlling execution of requested memory read operations on memory cells in the at least one other sector of memory cells.

7. The nonvolatile memory device of claim 1, wherein:
   upon reception of the requested memory modify operation on memory cells in the at least one other sector, the control circuitry controls the nonvolatile memory device to:
      access the at least one memory cell in the first sector of memory cells to obtain at least one data value stored in the at least one memory cell; and
      determine whether the at least one data value indicates that the at least one other sector is modify protected.

8. The nonvolatile memory device of claim 1, wherein:
   a set of memory cells in the first sector is capable of identifying substantially any sector of memory cells as being modify protected; and
   upon reception by the nonvolatile memory device of a second requested memory modify operation on memory cells in the set of memory cells, the control circuitry determines whether the nonvolatile memory device received a high voltage signal, and selectively prevents execution of the second requested memory modify operation based upon the determination.

9. The nonvolatile memory device of claim 8, wherein the control circuit comprises:
   a high voltage detection circuit for detecting the reception of a high voltage signal.

10. The nonvolatile memory device of claim 1, wherein:
    a set of memory cells in the first sector is capable of identifying substantially any sector of memory cells as being modify protected; and
    upon reception by the nonvolatile memory device of a second requested memory modify operation on memory cells in the set of memory cells, the control circuitry determines whether the nonvolatile memory device received a high voltage signal, and controls execution of the second requested memory modify operation based upon the determination.

11. The nonvolatile memory device of claim 1, wherein:
    the nonvolatile memory device is disposed in an electronics device having a processing unit therein.

12. The nonvolatile memory device of claim 1, wherein:
    a set of memory cells in the first sector is capable of identifying substantially any sector of memory cells as being modify protected;
    the nonvolatile memory device further comprises memory modify circuitry, coupled to the array and the address decode circuitry and controlled by the control circuitry, for cooperating with the address decode circuitry and the control circuitry to perform memory modify operations on memory cells in the array, memory modify operations performed on the set of memory cells utilizing the same memory modify circuitry utilized in memory modify operations performed on memory cells not in the set of memory cells.

13. The nonvolatile memory device of claim 1, wherein:
    the nonvolatile memory device is a flash memory device.

14. A method of performing a memory modify operation memory cells in a nonvolatile memory device having an array of memory cells partitioned into a plurality of sectors, the method comprising:
    receiving a request to perform a memory modify operation in a first sector;
    searching at least one memory cell in the array and determining whether the at least one memory cell identifies the first sector as being modify protected; and
    upon an affirmative determination that the at least one memory cell identifies the first sector as being modify protected, preventing the memory modify operation from occurring.

15. The method of claim 14, further comprising:
initially storing in the at least one memory cell a data value indicative of whether the at least one memory cell identifies the first sector as being modify protected.

16. The method of claim 14, further comprising:
initially maintaining data values in a plurality of first memory cells, including the at least one memory cell, indicating whether any of the sectors in the nonvolatile memory device is modify protected.

17. The method of claim 14, further comprising:
upon an affirmative determination that the at least one memory cell identifies the first sector as not being modify protected, executing the memory modify operation.

18. The method of claim 14, wherein the at least one memory cell is in the first sector.

19. The method of claim 14, wherein:
the at least one memory cell is requested for modification by the memory modify operation; and
the method further comprises:
determining whether the nonvolatile memory device received a high voltage signal associated with the request to perform the memory modify operation; and
upon an affirmative determination that the nonvolatile memory device received a high voltage signal associated with the request to perform the memory modify operation and upon an affirmative determination that the at least one memory cells identifies the first sector as being not modify protected, executing the requested memory modify operation.

20. The method of claim 14, wherein:
the at least one memory cell is requested for modification by the memory modify operation; and
the method further comprises:
determining whether the nonvolatile memory device received a high voltage signal associated with the request to perform the memory modify operation; and
the step of preventing prevents the memory modify operation from occurring upon an affirmative determination that the nonvolatile memory device received a high voltage signal associated with the request to perform the memory modify operation.

21. An integrated circuit, comprising:
a nonvolatile memory device, comprising:
an array of nonvolatile memory cells partitioned into sectors, at least some memory cells in a first sector maintaining data indicating whether any sector is modify protected; and
control circuitry for selectively preventing a memory modify operation in an addressed sector from occurring based upon a data value maintained in the at least some memory cells in the first sector.

22. The integrated circuit of claim 21, wherein:
a set of memory cells in the first sector is capable of identifying any sector of memory cells as being modify protected.

23. The integrated circuit of claim 22, wherein:
each memory cell in the set of memory cells is dedicated to indicating whether a distinct sector of memory cells is modify protected.

24. The integrated circuit of claim 22, wherein:
a memory cell in the set of memory cell is dedicated to indicating whether the first sector of memory cells is modify protected.

25. The integrated circuit of claim 21, wherein:
the control circuitry selectively controls execution of a requested memory modify operation on memory cells in the at least one other sector upon an affirmative determination that at least one memory cell in the first sector indicates the at least one other sector of memory cells is modifiable.

26. The integrated circuit of claim 21, wherein:
the control circuitry selectively controls execution of requested memory read operations on the at least one memory cell in the first sector of memory cells using the same sequence of internally executed operations used in controlling execution of requested memory read operations on memory cells in the at least one other sector of memory cells.

27. The integrated circuit of claim 21, wherein:
upon reception of the requested memory modify operation on memory cells in the at least one other sector, the control circuitry controls The integrated circuit to:
access the at least one memory cell in the first sector of memory cells to obtain at least one data value stored in the at least one memory cell; and
determine whether the at least one data value indicates that the at least one other sector is modify protected.

28. The integrated circuit of claim 21, wherein:
a set of memory cells in the first sector is capable of identifying substantially any sector of memory cells as being modify protected; and
upon reception by The integrated circuit of a second requested memory modify operation on memory cells in the set of memory cells, the control circuitry determines whether The integrated circuit received a high voltage signal, and selectively prevents execution of the second requested memory modify operation based upon the determination.

29. The integrated circuit of claim 28, wherein the control circuit comprises:
a high voltage detection circuit for detecting the reception of a high voltage signal.

30. The integrated circuit of claim 21, wherein:
a set of memory cells in the first sector is capable of identifying substantially any sector of memory cells as being modify protected; and
upon reception by The integrated circuit of a second requested memory modify operation on memory cells in the set of memory cells, the control circuitry determines whether The integrated circuit received a high voltage signal, and controls execution of the second requested memory modify operation based upon the determination.

31. An electronics device, comprising:
a processing unit; and
a nonvolatile memory device coupled to the processing unit, comprising:
an array of nonvolatile memory cells partitioned into sectors, at least some memory cells in a first sector maintaining data indicating whether any sector is modify protected; and
control circuitry for selectively preventing a memory modify operation in an addressed sector from occurring based upon a data value maintained in the at least some memory cells in the first sector.

* * * * *

UNITED STATES PATENT AND TRADEMARK OFFICE
CERTIFICATE OF CORRECTION

PATENT NO. : 6,490,197 B1 Page 1 of 1
DATED : December 3, 2002
INVENTOR(S) : Luca G. Fasoli It is certified that error appears in the above-identified patent and that said Letters Patent is hereby corrected as shown below:

<u>Column 8,</u>
Lines 56-57, replace "A method of performing a memory modify operation memory cells" with -- A method of performing a memory modify operation for memory cells --

Signed and Sealed this

Twentieth Day of April, 2004

JON W. DUDAS
*Acting Director of the United States Patent and Trademark Office*